United States Patent
Cheng et al.

(10) Patent No.: US 7,929,317 B2
(45) Date of Patent: Apr. 19, 2011

(54) MOUNTING APPARATUS FOR EXPANSION CARD

(75) Inventors: Cheng-Lung Cheng, Taipei Hsien (TW); Jun-Xiong Zhang, Shenzhen (CN); Jia-Qi Fu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 814 days.

(21) Appl. No.: 11/923,666

(22) Filed: Oct. 25, 2007

(65) Prior Publication Data

US 2008/0259582 A1 Oct. 23, 2008

(30) Foreign Application Priority Data

Apr. 20, 2007 (CN) .......................... 2007 1 0200488

(51) Int. Cl.
*H05K 7/14* (2006.01)
*H05K 7/18* (2006.01)
(52) U.S. Cl. .................... 361/801; 361/802; 361/803
(58) Field of Classification Search .......... 361/801–803, 361/687, 703, 704, 717, 719
See application file for complete search history.

(56) References Cited

U.S. PATENT DOCUMENTS

| | | | | |
|---|---|---|---|---|
| 5,642,263 | A | * | 6/1997 | Lauruhn ...................... 361/801 |
| 5,943,218 | A | * | 8/1999 | Liu .............................. 361/801 |
| 6,056,579 | A | * | 5/2000 | Richards et al. ............. 439/358 |
| 6,116,566 | A | * | 9/2000 | Brown et al. ................. 248/694 |
| 7,573,704 | B2 | | 8/2009 | Chen |
| 2007/0030652 | A1 | * | 2/2007 | Chen ............................ 361/704 |
| 2008/0101033 | A1 | * | 5/2008 | Cromwell et al. ............ 361/719 |

FOREIGN PATENT DOCUMENTS

| | | |
|---|---|---|
| CN | 2798165 Y | 7/2006 |
| CN | 2874612 Y | 2/2007 |

* cited by examiner

*Primary Examiner* — Hung S Bui
(74) *Attorney, Agent, or Firm* — Frank R. Niranjan

(57) ABSTRACT

A mounting apparatus for fixing an expansion card to a circuit board, includes a mounting member fixed on the circuit board, and a locking member. The mounting member includes a pivot portion and a mounting portion formed on two ends thereof respectively. A hook extends from the pivot portion. The locking member includes a connecting portion and a latch portion formed on two ends thereof respectively. A notch is defined in the connecting portion. The locking member is pivotably connected to the mounting member via the connecting portion of the locking member connecting to the pivot portion of the mounting member. The latch portion is capable of being inserted in the mounting portion to fix the expansion card to the supporter. The hook is capable of engaging in the notch to confine the locking member relative to the mounting member.

17 Claims, 5 Drawing Sheets

MOUNTING APPARATUS FOR EXPANSION CARD

BACKGROUND

1. Field of the Invention

The present invention relates to mounting apparatuses, and more particularly to a mounting apparatus for an expansion card.

2. Description of Related Art

Computer systems typically require or include expansion cards which extend the capabilities of computer systems by providing dedicated hardware to achieve a variety of tasks. A conventional expansion card includes a main body electrically connectable with a motherboard in a computer system, and a generally L-shaped stop plate installable on a rear plate of the computer system. The stop plate is typically installed on the rear plate by a screw. However, if the screw is not properly fastened, the expansion card is easy to come adrift or be tilted in the case that a distal end of the expansion card accidentally impacts something, and the motherboard or the expansion card may be damaged.

What is needed, therefore, is a mounting apparatus which facilitates the convenient and secure mounting of an expansion card.

SUMMARY

A mounting apparatus for fixing an expansion card to a supporter, the mounting apparatus includes a mounting member fixed on the supporter, and a locking member. The mounting member includes a pivot portion and a mounting portion formed on two ends thereof respectively. A hook extends from the pivot portion. The locking member includes a connected portion and a latch portion formed on two ends thereof respectively. A notch is defined in the connecting portion. The locking member is pivotably connected to the mounting member via the connecting portion of the locking member connecting to the pivot portion of the mounting member. The latch portion engages with the mounting portion to sandwich the expansion card between the mounting member and the locking member in a first position. The hook is capable of engaging in the notch to retain the locking member relative to the mounting member in a second position allowing the expansion card to be detached.

Other advantages and novel features will become more apparent from the following detailed description of preferred embodiment when taken in conjunction with the accompanying drawings, in which:

DETAILED DESCRIPTION

Figure 1:
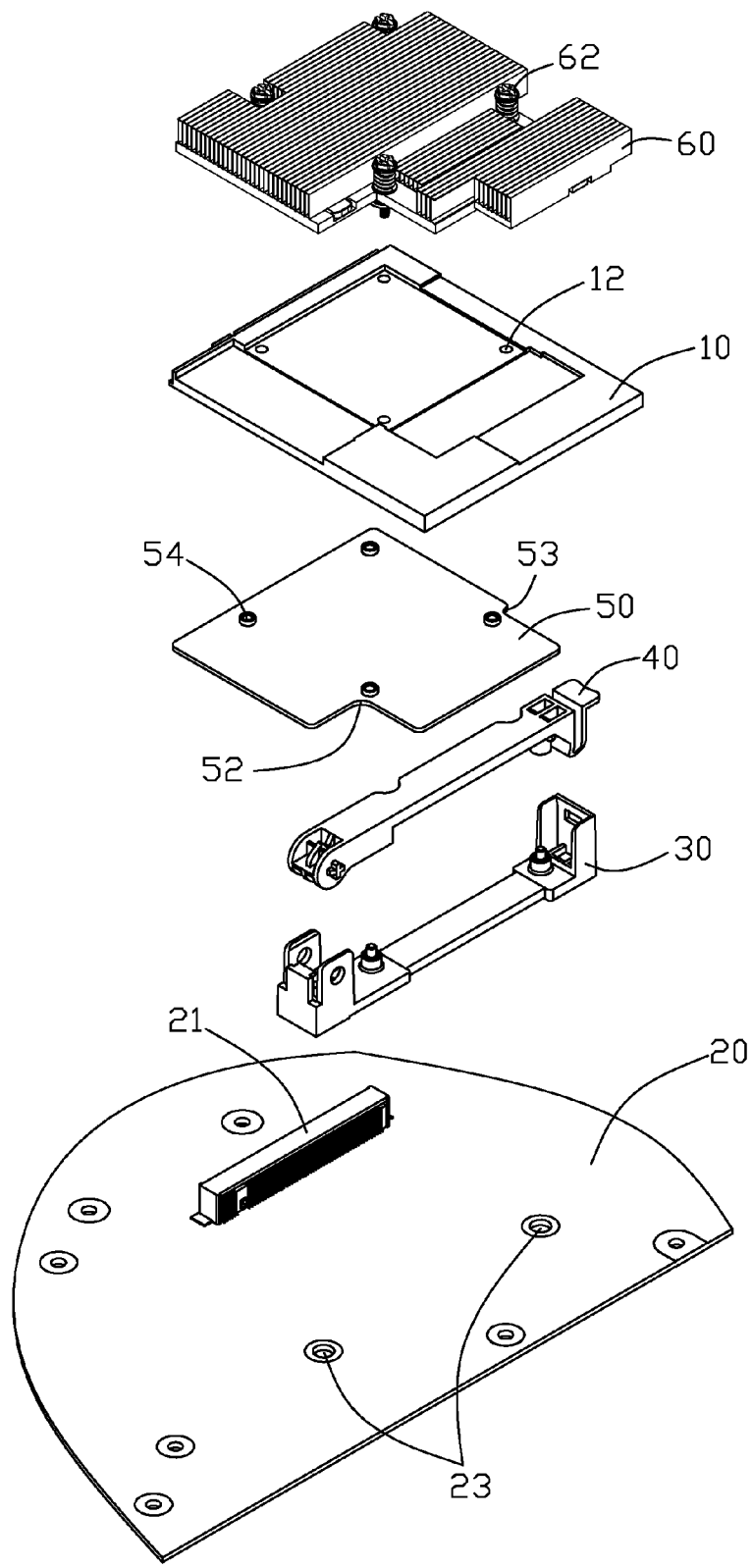
FIG. 1 is an exploded, isometric view of a mounting apparatus together with a motherboard and an expansion card in accordance with a preferred embodiment of the present invention, the mounting apparatus includes a mounting member, and a locking member.

Referring to FIG. 1, a mounting apparatus is provided in accordance with an embodiment of the present invention, for fixing an expansion card 10 in a circuit board. The mounting apparatus includes a mounting member 30, a locking member 40, a mounting plate 50, and a cooling member 60. In this embodiment, the circuit board is a motherboard 20.

The expansion card 10 includes a main plate, and a plug formed at one end of the main plate. A plurality of through holes 12 is defined in the main plate.

A socket 21 is installed on the motherboard 20 corresponding to the plug of the expansion card 10. Two through holes 23 are defined in the motherboard 20 in the vicinity of the socket 21.

Figure 2:
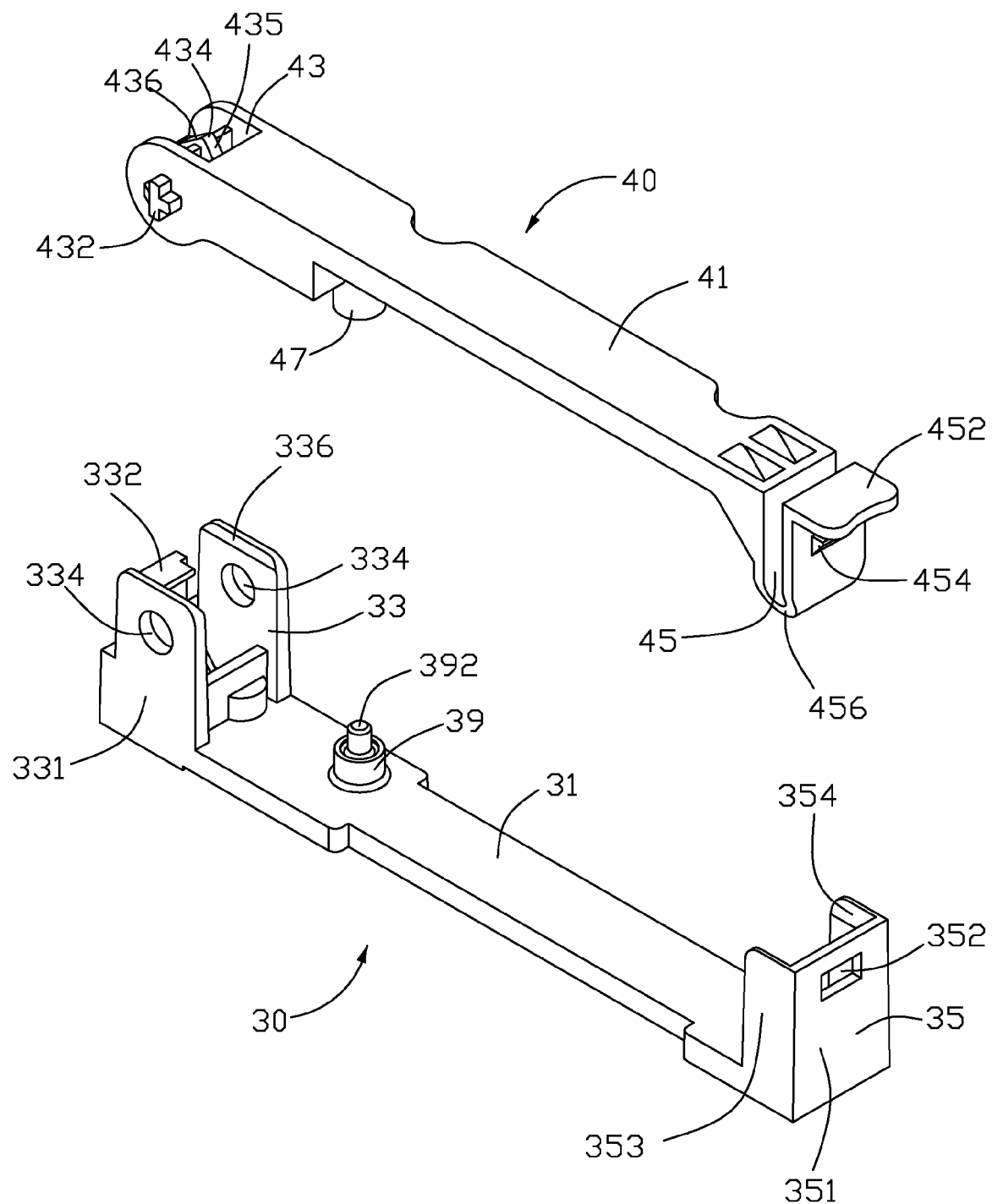
FIG. 2 is an enlarged view of the mounting member and the locking member of FIG. 1, but viewed from another aspect.
Figure 3:
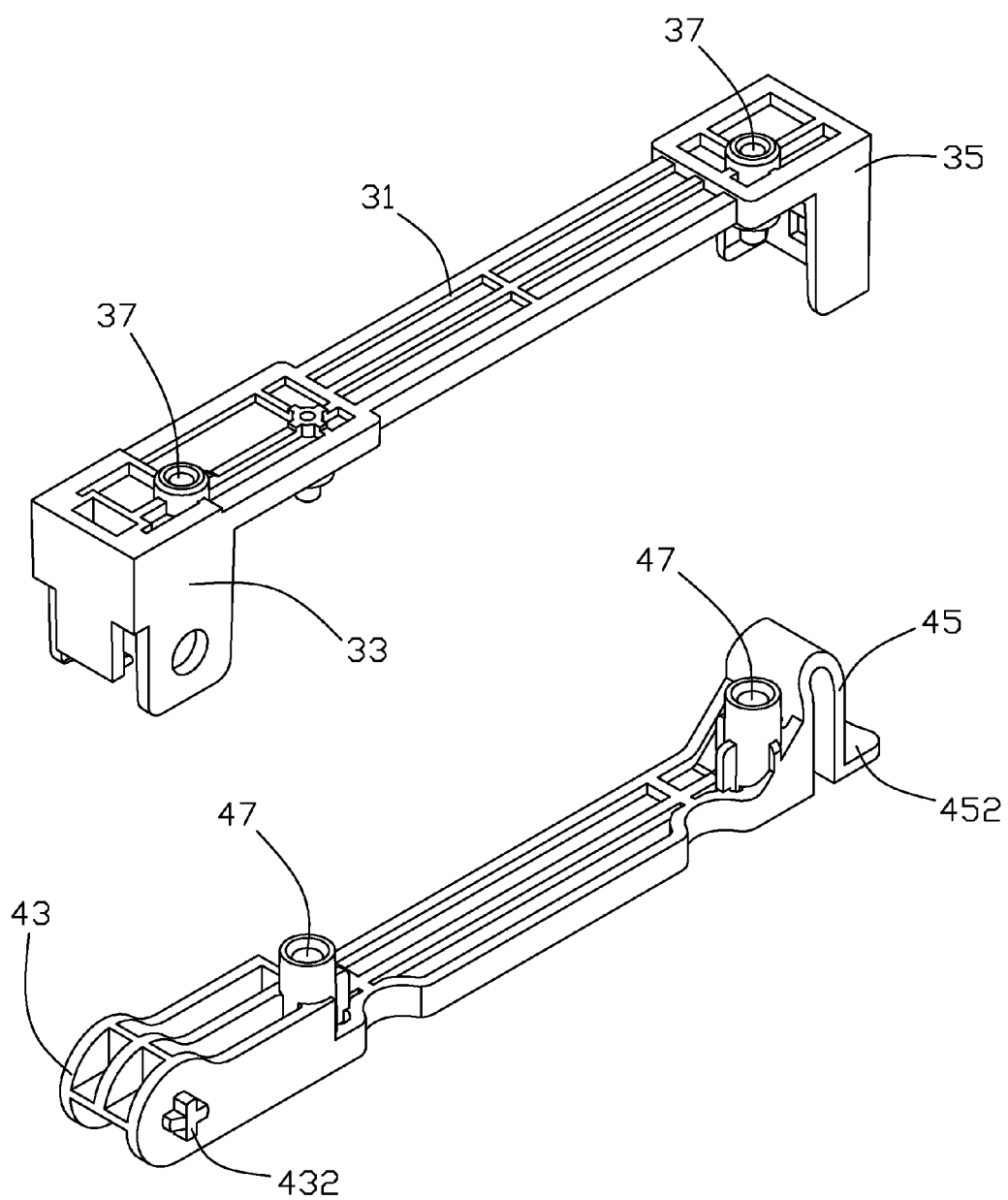
FIG. 3 is an enlarged, inverted view of the mounting member and the locking member of FIG. 1.

Referring also to FIGS. 2 and 3, the mounting member 30 includes an elongated main body 31. A pivot portion 33 and a mounting portion 35 protrude from two opposite ends of the main body 31, at a same side, respectively. The pivot member 33 includes two mounting pieces 331 extending from two opposite sides of one end of the main body 31 respectively, and a generally L-shaped hook 332 formed at an end edge of the one end of the main body 31. A pivot hole 334 is defined in each mounting piece 331. An inclined surface 336 is formed on an inner side of a top portion of each mounting piece 331 to form a guiding surface.

The mounting portion 35 includes a locating piece 351 formed at the other end of the main body 31, and two opposite sidewalls 353 formed at two sides of the other end respectively. A locating hole 352 is defined in the locating piece 351. An inclined surface 354 is formed on an inner side of a top portion of each sidewall 353. Two mounting holes 37 are defined in another side of the main body 31. Two protrusions 39 protrude from the mounting member 30 at the same side as and between the pivot portion 33 and the mounting portion 35. A rod 392 extends from a top portion of each protrusion 39.

Figure 5:
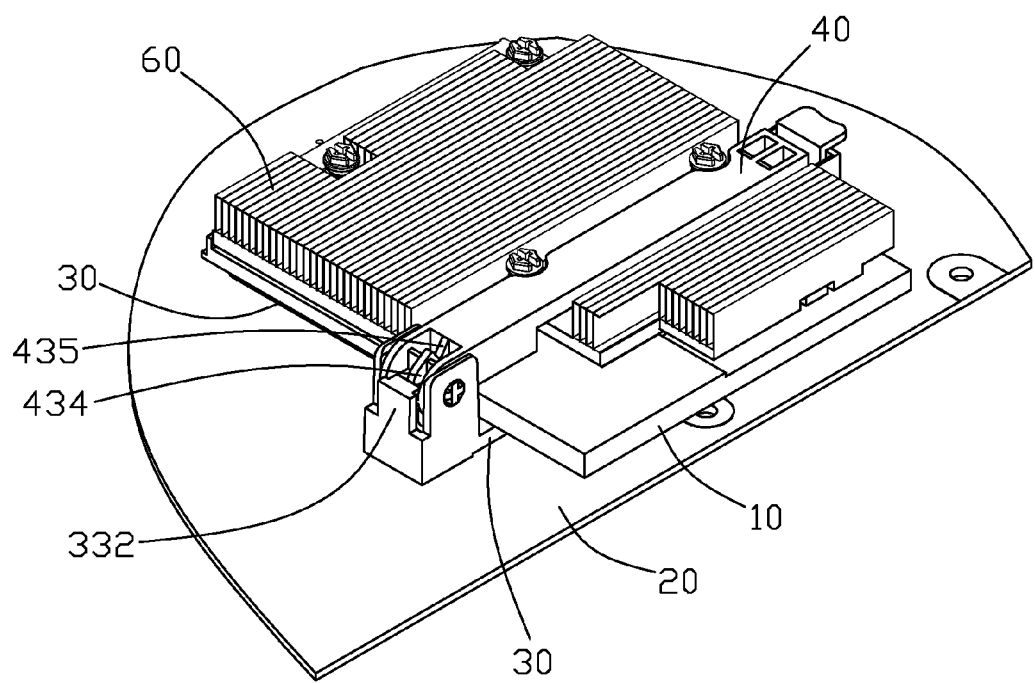

The locking member 40 includes an elongated main body 41. A connecting portion 43 and a latch portion 45 protrude from two opposite ends of the main body 41 respectively. Two pivots 432 extend from opposite faces of the connecting portion 43 respectively. A block 434 is formed at a middle portion of the connecting portion 43. A V-shaped notch 435, shown in FIG. 5, is defined in the block 434. A sliding surface 436 is formed at the block 434 in the vicinity of the notch 435. The latch portion 45 is generally U-shaped. A handle 452 is formed at a distal end of the latch portion 45. A locating block 454 extends from an outer side of the latch portion 45. Two inclined side sections 456 are formed at opposite sides of a bottom portion of the latch portion 45. Two poles 47 protrude from the main body 41 adjacent to the connecting portion 43 and the latch portion 45 respectively.

The mounting plate 50 is generally T-shaped. Two L-shaped locating portions 52, 53 are formed at opposite sides of the mounting plate 50. A plurality of screw holes 54 is defined in the mounting plate 50. A plurality of screws 62 is attached to the cooling member 60.

Figure 4:
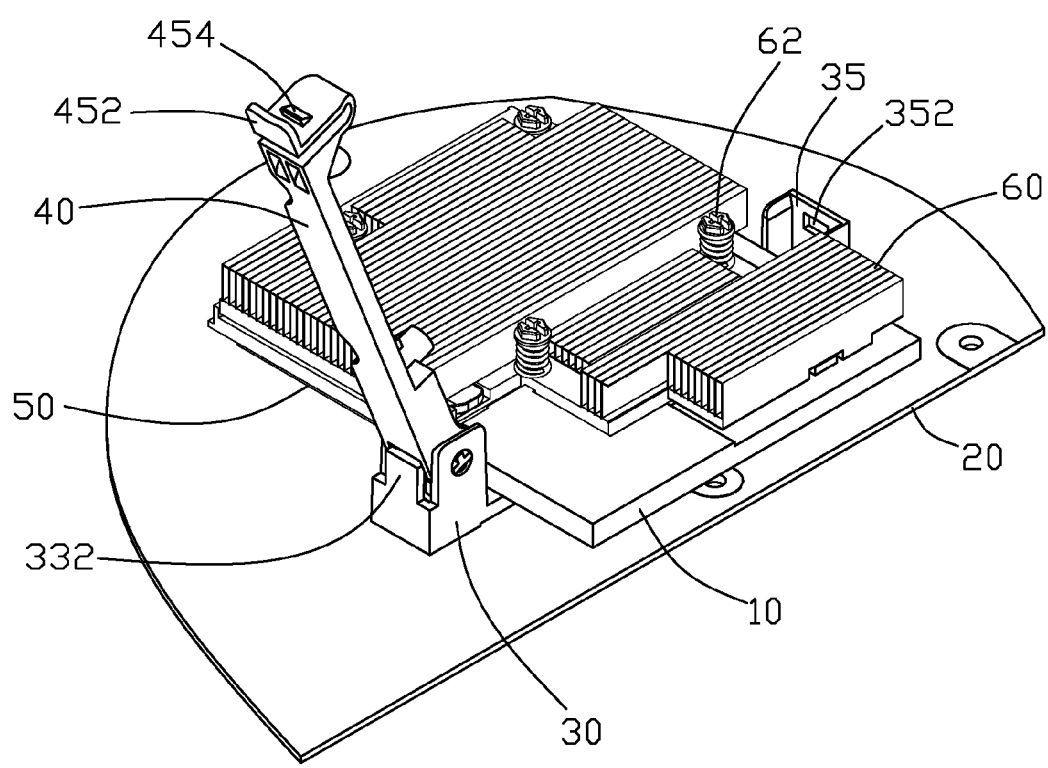
FIGS. 4 and 5 are assembled views of FIG. 1 respectively showing two using states.

Referring also to FIG. 4, in assembly, the screws 62 of the cooling member 60 extend through the through holes 12 of the expansion card 10 respectively to screw in the screw holes 54 of the mounting plate 50. The cooling member 60, the expansion card 10, and the mounting plate 50 are assembled together to form an expansion card assembly. The mounting member 30 is mounted to the motherboard 20 via two fasteners, such as two screws, extending through the through holes 23 of the motherboard 20 to screw into the mounting holes 37 of the mounting member 30 respectively. The connecting portion 43 of the locking member 40 is pivotably connected to the pivot portion 33 of the mounting member 30 via the pivots 432 of the connecting portion 43 sliding over the inclined surfaces 336 of the pivot portion 33 to engage in the pivot holes 334 of the pivot portion 33 respectively.

In mounting the expansion card 10 to the motherboard 20, the locking member 40 is rotated away from the mounting member 30. The sliding surface 436 of the block 434 of the connecting portion 43 engages with a horizontal portion of the hook 332 of the mounting member 30 to deform the hook 332 outward until an angle between the locking member 40 and the mounting member 30 is larger than a predetermine angle such as 90 degrees. The horizontal portion of the hook 332 of the mounting member 30 goes over the sliding surface 436 and then rebounds to engage in the notch 435 of the block 433 to retain the locking member 40 to the mounting member 30. The expansion card assembly is placed on the mounting member 30. The plug of the expansion card 10 is connected to the socket 21 of the motherboard 20. The locating portions 52, 53 are placed on the protrusions 39 of the mounting member 30, and abut against the rods 392 respectively for confining the expansion card assembly. Referring to FIG. 5, the handle 452 of the locking member 40 is operated to rotate the locking member 40 toward the mounting member 30. The latch portion 45 of the locking member 40 is inserted into the mounting portion 35. The locating block 454 of the latch portion 45 engages in the locating hole 352 of the mounting portion 35, the locking member 40 is thus locked to the mounting member 30. The poles 47 of the locking member 40 press the expansion card assembly to the mounting member 30. Thus the expansion card assembly is sandwiched between the mounting member 30 and the locking member 40. The inclined surfaces 354 of the mounting portion 35 and the inclined side sections 456 of the latch portion 45 cooperatively facilitate entry of the latch portion 45 into the mounting portion 35.

In removing the expansion card 10 from the motherboard 20, the handle 452 of the locking member 40 is operated to deform the latch portion 45 to disengage the locating block 454 from the locating hole 352 of the mounting member 30. Then the locking member 40 is rotated away from the mounting member 30. Thus the expansion card assembly is then ready to be removed from the motherboard 20.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment of the invention.

What is claimed is:

1. A mounting apparatus for fixing an expansion card to a circuit board, the mounting apparatus comprising:
   a mounting member configured to be fixed on the circuit board, the mounting member comprising a pivot portion and a mounting portion formed on two ends thereof respectively, a hook extending from the pivot portion; and
   a locking member comprising a connecting portion and a latch portion formed on two ends of the locking member respectively, a notch defined in the connecting portion;
   wherein the locking member is pivotably connected to the mounting member via the connecting portion of the locking member pivotably connecting to the pivot portion of the mounting member, the latch portion of the locking member engages with the mounting portion to sandwich the expansion card between the mounting member and the locking member in a first position, the hook is engagable in the notch to retain the locking member relative to the mounting member in a second position allowing the expansion card to be detached from the circuit board.

2. The mounting apparatus as claimed in claim 1, wherein a locating hole is defined in the mounting portion of the mounting member, a locating block protrudes from the latch portion configured for engaging in the locating hole in the first position.

3. The mounting apparatus as claimed in claim 1, wherein a pole depends from the locking member configured for pressing the expansion card toward the mounting member.

4. The mounting apparatus as claimed in claim 1, wherein the latch portion is generally U-shaped, a handle is formed at a distal end of the latch portion.

5. The mounting apparatus as claimed in claim 1, wherein a block is formed at a middle portion of the connecting portion, the notch is defined in the block.

6. The mounting apparatus as claimed in claim 5, wherein a sliding surface is formed on the block adjacent the notch for deforming the hook in the course of the locking member moving from the first position to the second position before the hook rebounds to engage in the notch.

7. An assembly comprising:
   a motherboard with a socket formed thereon;
   an expansion card with a plug received in the socket, the expansion card being in parallel with the motherboard;
   a mounting member installed on the motherboard for supporting a free end of the expansion card away from the plug; and
   a locking member pivotably connected to one end of the mounting member and being rotatable to lock with the other end of the mounting member to cooperate with the mounting member to sandwich the free end of the expansion card therebetween, thereby securing the expansion card to the motherboard;
   wherein a mounting plate is mounted to the expansion card, the mounting member forms a pair of protrusions to support the mounting plate.

8. The assembly as claimed in claim 7, wherein the mounting plate is generally T-shaped, and forms a pair of locating portions, the protrusions of the mounting member each forms a rod to confine one of the locating portions thereby locating the combined mounting plate and expansion card in a direction perpendicular to another direction in which the plug is inserted into the socket.

9. The assembly as claimed in claim 7, wherein the mounting member comprises a pivot portion and a mounting portion formed at two opposite ends thereof.

10. The assembly as claimed in claim 9, wherein the locking member comprises a connecting portion connectable to the pivot portion of the mounting member and a latch portion lockable to the mounting portion of the mounting member.

11. An assembly comprising:
   a circuit board with a socket formed thereon;
   an expansion card with a plug inserted in the socket;
   a mounting member fixed stationary with respect to the circuit board, the mounting member comprising a pivot portion and a mounting portion formed at two opposite ends thereof; and
   a locking member configured to cooperate with the mounting member to sandwich therebetween a free end of the expansion card away from the plug, the locking member comprising a connecting portion pivotably connected to the pivot portion of the mounting member and a deformable latch portion being deformed and then rebounding to lock with the mounting portion of the mounting member such that the free end of the expansion card is firmly sandwiched between the locking member and the mounting member to thereby secure the expansion card to the circuit board;

wherein the mounting member is attached to the circuit board and the expansion card is parallel to the circuit board.

12. The assembly as claimed in claim 11, wherein the latch portion of the locking member is U-shaped, a handle is formed at a distal end of the latch portion to facilitate detaching the latch portion from the mounting portion of the mounting member.

13. The assembly as claimed in claim 12, wherein a locating hole is defined in the mounting portion of the mounting member, a locating block protrudes from the latch portion adjacent to the handle configured to engage in the locating hole.

14. The assembly as claimed in claim 11, wherein a pole depends from the locking member configured to press the expansion card toward the mounting member.

15. The assembly as claimed in claim 11, wherein a heat dissipating device is attached on one side of the expansion card via a mounting plate located at an opposite side of the expansion card.

16. The assembly as claimed in claim 15, wherein the mounting plate defines, at opposite sides thereof, a pair of cutouts to form a pair of locating portions around the cutouts respectively, the mounting member forms a pair of protrusions for supporting the mounting plate thereon, each protrusion forms a rod to confine one of the locating portions thereby retaining the combined mounting plate, expansion card and heat dissipating device in a direction perpendicular to another direction in which the plug is inserted into the socket.

17. The assembly as claimed in claim 11, wherein the pivot portion of the locking member defines a locking notch, and the connecting portion of the locking member forms a hook configured to engage in the locking notch to retain the locking member at a released position where the expansion card is detachable away from the circuit board.

* * * * *